United States Patent [19]
Robinton et al.

[11] Patent Number: 4,573,037
[45] Date of Patent: Feb. 25, 1986

[54] ANALOG-TO DIGITAL CONVERTER AND METHOD

[75] Inventors: Michael A. Robinton, Palo Alto; Alan H. Starkie, San Jose, both of Calif.

[73] Assignee: Robinton Products, Inc., Sunnyvale, Calif.

[21] Appl. No.: 518,832

[22] Filed: Aug. 1, 1983

[51] Int. Cl.⁴ ............................................. H03K 13/02
[52] U.S. Cl. ........................... 340/347 NT; 324/99 D; 328/135; 340/347 CC; 340/347 AD; 340/347 M; 377/42
[58] Field of Search ................. 340/347 AD, 347 NT, 340/347 CC, 347 M; 324/76 A, 78 R, 78 D, 78 E, 79 D, 99 D; 328/28, 135; 377/42

[56] References Cited
U.S. PATENT DOCUMENTS

| | | | |
|---|---|---|---|
| 4,009,475 | 2/1977 | DeFreitas | 340/347 AD |
| 4,031,532 | 6/1977 | First | 340/347 NT |
| 4,083,043 | 4/1978 | Breuer | 340/347 AD |
| 4,291,300 | 9/1981 | Bader | 340/347 AD |

Primary Examiner—T. J. Sloyan
Attorney, Agent, or Firm—Limbach, Limbach & Sutton

[57] ABSTRACT

A system and method is provided for producing digital signals proportional to selected parameters of an input signal supplied to a modulator. The modulated output of the modulator is supplied to a delaying bistable circuit, and both the original output and the delayed output are then supplied to a gate, together with a clocking signal. The output of the gate includes pulses only when the modulated signal and the delayed modulated signal are simultaneously at the same level. As such, the digital output of the gate is a representation of the amount by which one level of the modulated signal exceeds the other, and is directly proportional to the magnitude of one polarity of the signal input to the modulator. Techniques are described for extracting digital signals proportional to the magnitudes of both the positive and negative half waves of the input signal, full waveform magnitude, and waveform offset and polarity.

21 Claims, 3 Drawing Figures

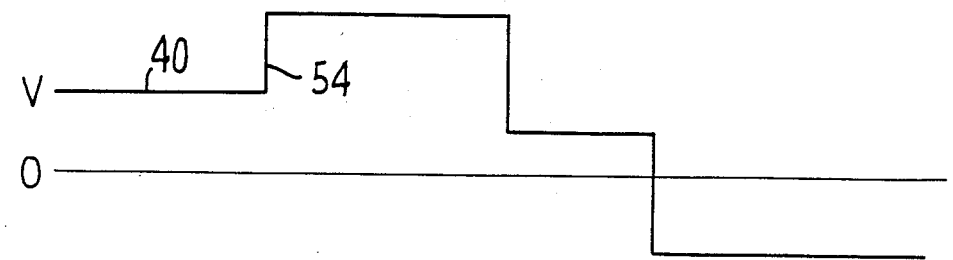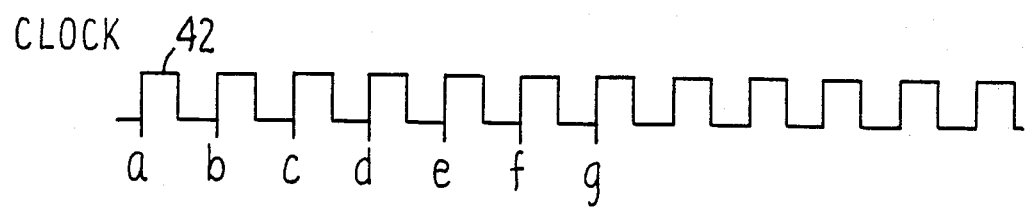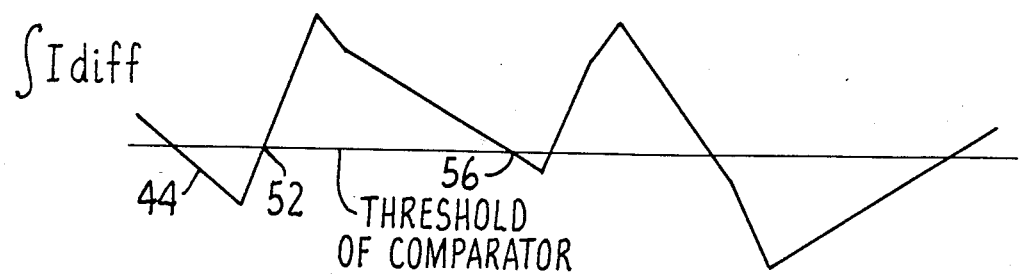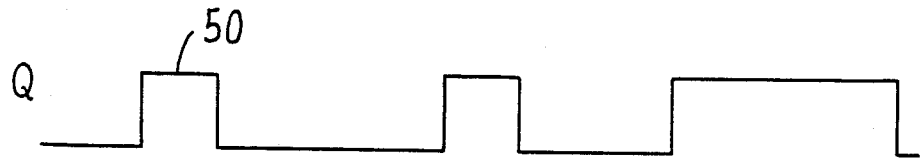
FIG. 2.

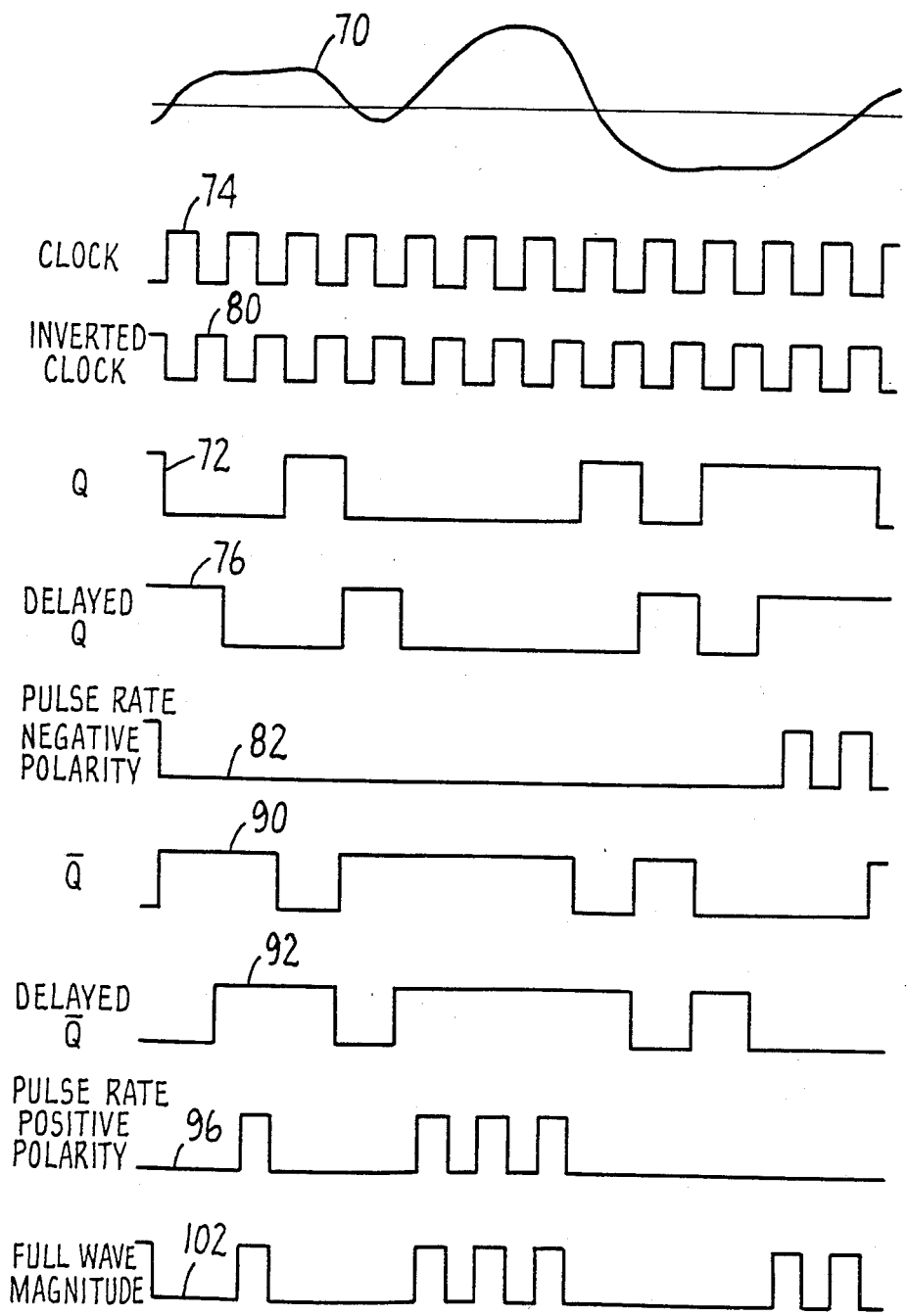

ANALOG-TO DIGITAL CONVERTER AND METHOD

BACKGROUND OF THE INVENTION

The invention relates generally to a system and method of measuring and processing modulated signals, and more particularly to systems and methods for producing digital signals proportional to certain parameters of modulated signals.

Modulators of various types are used to convert an analog input signal to an output pulse train in which pulse density or pulse width or another parameter is proportional to the magnitude and polarity of the input signal. An example of a modulator having high accuracy over a wide dynamic range, and which is therefore suitable for use in electric power metering, is described in copending patent application Ser. No. 518,820, filed Aug. 1, 1983, entitled Pulse Modulator And Method With Wide Dynamic Range, assigned to the assignee of the present invention.

For measurement of power or other waveforms, it is often useful to obtain digital or pulse train representations of certain signal parameters such as full or half wave rectified signal magnitude, signal offset and polarity. It has not heretofore been convenient to extract such parameters particularly in digital form.

It would be advantageous to be able to determine certain useful parameters of an input waveform, such as the overall magnitude of an alternating polarity waveform, the magnitudes of each respective polarity, and average value, from a modulated signal proportional to the input signal. It would be particularly useful to obtain such information from a modulated input signal where the modulation is already performed for other useful purposes, as in the case of power meters, which employ modulations to accomplish signal multiplication.

SUMMARY OF THE INVENTION

Accordingly, a system is provided for producing digital signals proportional to selected parameters of an input signal which has been converted to a modulated signal varying between two levels in a manner proportional to the amplitude and polarity of the input signal. The system includes means for producing clock pulses at predetermined clock intervals. Means for delaying the modulated signal are provided, to produce a second modulated signal substantially equal to the first modulated signal and delayed in time by one clock interval. The modulated signal and delayed second modulated signal are applied to an AND gate, together with clock pulses. The AND gate outputs a first digital signal containing output pulses, at intervals of not less than the clock intervals, whenever the modulated signal and the delayed second modulated signal are simultaneously at predetermined levels. The result is that the first digital signal carries information relating to the magnitude and polarity of the input signal.

In one preferred form, the invention includes one AND gate for producing a first digital signal proportional to the magnitude of one polarity of the input signal, and a second AND gate to produce a digital signal proportional to the magnitude of the other polarity of the input signal. Additional embodiments are also described.

The invention further provides a method of producing digital signals proportional to selected parameters of an input signal by the steps in the method. The input signal is first converted to a first modulated signal, which is changable between two levels at predetermined clock intervals in a manner proportional to the amplitude and polarity of the input signal. A second modulated signal is then provided, substantially equal to the first modulated signal and delayed in time by one clock interval. Finally, the first and second modulated signals are combined, together with a clock signal containing pulses at the predetermined clock intervals, at an AND gate, to produce a first digital signal. The output first digital signal contains pulses at intervals of not less than the clock intervals whenever the first and second modulated signals are simultaneously at one level. The first digital signal carries information relating to the magnitude and polarity of the input signal. Additional embodiments of the method are also described.

BRIEF DESCRIPTION OF THE DRAWINGS

FIG. 2 is a set of graphic traces representing various waveforms associated with the modulator used with the preferred system of the present invention.

FIG. 3 is a set of graphic traces representing various waveforms, including several examples of digital outputs produced by the system and method of the present invention.

DESCRIPTION OF THE PREFERRED EMBODIMENT

Figure 1:
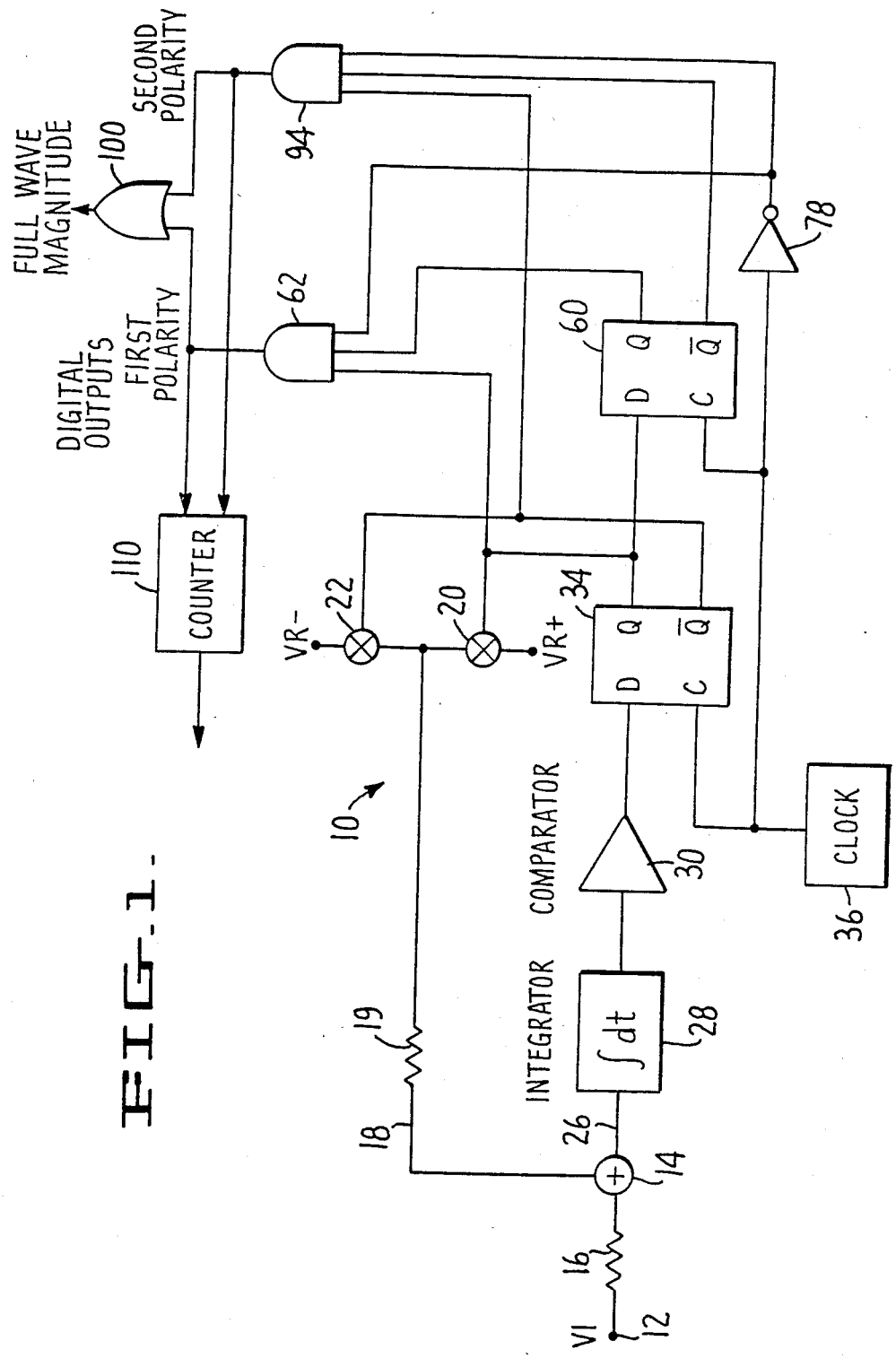
FIG. 1 is a schematic block diagram of a modulator and output system according to the present invention.

Referring to FIG. 1, the illustrated circuit includes a modulator, indicated generally at 10, for modulating an input signal supplied to an input point 12. The illustrated modulator is of a type which employs delta-minus-sigma modulation. Such a modulator is described in greater detail in application Ser. No. 518,820, filed Aug. 1, 1983, entitled "Pulse Modulator and Method with Wide Dynamic Range", invented by the same inventors as the present invention. In general, delta-minus-sigma modulation employs feedback of the output pulse train, or reference voltages controlled by the output pulse train, to a summing node to which the input signal is also supplied. Node 14, in FIG. 1, is a summing node. An input signal, such as voltage V1 at input 12 is supplied to summing node 14 through resistor 16. One of two reference signals, preferably of equal magnitude and opposite polarity are also supplied to the summing node, through line 18 and impedance 19. The reference voltage VR+ and VR− are connected to the summing node through a pair of switches 20 and 22, respectively, which are controlled by the modulator output. Delta-minus-sigma modulation serves to maintain the overall total current supplied to the summing node by the reference signals in balance with the input signal. Any instantaneous differences between the current into and out of node 14 appears on line 26, where it is supplied to an integrator 28, which produces an ascending or descending ramp voltage. The integrated signal is then compared against a threshold level by a comparator 30, which outputs a control signal on line 32 indicating whether the output of integrator 28 is above or below the threshold level. The output of comparator 30 is supplied to a bistable circuit, such as flip-flop 34.

The bistable circuit changes states only at predetermined clock intervals, as determined by clock 36. When the integrated signal crosses the threshold level of comparator 30, the outputs of bistable circuit 34 reverse states at the next clock pulse. The Q output of bistable circuit 34, which is the first modulated signal of the present invention, controls switch 20, which connects the positive reference voltage VR+ to summing node 14. The $\overline{Q}$ output, which is always the inverse of the Q output, operates switch 22, connecting the negative reference voltage VR to summing node 14. Switches 20 and 22 are always operated alternately, meaning that one or the other of the reference signals is always supplied to summing node 14.

Because the Q and $\overline{Q}$ outputs of bistable circuit 34 reverse at the next clock pulse, whenever the threshold of comparator 30 is crossed, the magnitude of the signal integrated by integrator 28 is always relatively close to the threshold level of the comparator. Signal measurement is therefore always nearly optimal and the output pulse train reflects the input signal to a high degree of accuracy.

FIG. 2 provides an illustration of the operation of modulator 10. For simplicity, an input signal V1 with discreet voltage jumps is used, illustrated by line 40. Line 42 illustrates the output of clock 36, which can be a conventional oscillator. Since bistable circuit 34 clocks on each upwardly moving clock cycle, the clock pulses are identified by leading edges a, b, c, d, etc. Assuming switch 22 is initially closed, with the $\overline{Q}$ output high, the output of integrator 28 is initially a descending curve shown by line 44. Since the value of reference voltages VR+ and VR and impedance 24 are chosen to produce a current which is large relative to the input signal through impedance 16, current is initially being drawn from summing node 14, causing trace 44 to descend. A clock pulse a, the integrated signal has not yet crossed the threshold represented by line 46, consequently, line 44 continues to integrate downward. As it crosses the threshold of comparator 30, however, the comparator output represented by line 48 switches states. Consequently, at clock pulse b, bistable circuit 34 changes states, causing Q, represented by line 50, to go from low to high. That, in turn, causes switch 20 to close and switch 22 to open, connecting the VR+ reference voltage to the summing node through impedance 24. Integrator 28 then integrates upward, crossing the threshold at 52 and causing the output of comparator 30 to again change states. At the next clock pulse c, Q again goes low. As the input voltage changes, at 54, the slope of line 44 changes by the operation remains the same. It will integrate downward until crossing the threshold again at 56, causing Q to again change states and reverse the reference signal to summing node 14.

As the above-described process continues, the Q output of bistable circuit 34 will change between first and second levels, such as high and low, at the clock intervals, in a manner which produces an average level over any sufficient interval proportional to the input signal. It should be noted that in the illustrated example, the Q output is predominantly low when the input signal V1 is positive and is predominantly high when the input signal is negative. The polarity of Q is purely a matter of design choice and could be reversed, if desired, by reversing the connections to the reference voltages and also producing a compensatory inversion such as inversing the comparator inputs to maintain overall negative feedback within the modulator. A zero input will cause Q to be high exactly the same amount of time it is low, producing an average level exactly midway between the high and low levels. Positive or negative inputs will cause Q to be predominantly high or low, in the manner described above. Q can remain high or low for however long it takes the reference signals into summing node 14 to balance the input signal. In other words, the overall time that Q is at one level is directly related to the magnitude and polarity of the input signal.

The present invention takes the Q output of bistable circuit 34, termed the first modulated signal, and produces from it a digital signal proportional to a selected parameter of the input signal. One such parameter is the magnitude of one polarity of the input signal. Such a parameter is derived from a measurement of the amount of time by which one level of the Q output exceeds the other level, over time. That is accomplished by providing a second bistable circuit 60 to produce a second modulated signal at its Q output. The Q output of bistable circuit 34 is connected to the D input of bistable circuit 60 and both receive clock signals from the same clock 36. Because of gating delays, changes in the Q output of bistable circuit 60 will always follow changes in the Q output of bistable circuit 34 delayed by one clock pulse. An AND gate 62 is also provided to receive the Q outputs from both bistable circuits 34 and 60, as well as a clock signal from clock 36. The AND gate serves as means for outputting a first digital signal which is proportional to the magnitude of one polarity of the input signal.

FIG. 3 illustrates the operation of the above-described circuit elements, in conjunction with the method of the present invention. Assuming, for illustrative purposes, a randomly varying voltage waveform 70 is supplied to modulator input 12. The signal is converted to a first modulated signal at the Q output of bistable circuit 34 in the manner described above. The Q output of bistable circuit 34 is assumed to be that shown in waveform 72. Waveform 72 is produced in the same manner as waveform 50 of FIG. 2. The output of clock 36 is represented by waveform 74. The output of second bistable circuit 60 is termed "Delayed Q" and is represented by line 76. Delayed Q is substantially equal to Q, but delayed in time by one clock interval. The present invention calls for combining Q, Delayed Q and a clock signal at an AND gate 62 (see FIG. 1).

Although not necessary in idealized circuits in which component delays are nonexistent, for real-world components it is preferable to include an inverter 78 between clock 36 and AND gate 62. Inverter 78 inverts clock signal 74 to yield an inverted clock signal 80. The reason for supplying an inverted clock signal to the AND gate is because propagation delays in bistable circuits 34 and 60 will tend to cause their outputs to lag slightly behind the output of clock 36, and will produce short simultaneous "high" conditions in all three signals at the wrong time. The result of not inverting the clock is an extraneous spike output from AND gate 62, which would represent an error pulse. For this reason, inverter 78 is included in FIG. 1. The resultant waveform output by AND gate 62 is shown at 82 of FIG. 3.

Waveform 82 is essentially a digital representation of the amount by which the time Q is high exceeds the time Q is low. In the example of FIG. 3, waveform 82 contains only two pulses, generated successively, and appearing at the right side of the illustration. Those two pulses roughly coincide with the region where analog waveform 70 is most negative. Preferably, the frequency of the clock will greatly exceed the variations of the analog input signal, to produce higher resolutions than that shown in FIG. 3. The principle of operation is exactly the same, however. In essence, combining a delayed modulated signal with the original modulated signal at an AND gate produces an output which will go high only when Q remains high for at least two successive clock pulses. The clock signal causes the AND gate output to be a pulse train, having pulses at intervals of not less than the clock intervals of the clock signal. In the example just described, the AND gate outputs pulses only when all signals to it are high. If Q is low for two or more successive clock pulses, it will have no effect on the output of AND gate 62, since only high inputs are measured. Thus, the output of the AND gate is a representation of the magnitude of only one polarity of the input signal. The output is, in effect, a half wave rectified signal, represented digitally.

In order to produce a digital signal proportional to the other polarity of the input waveform, the preferred embodiment of the invention employs the $\overline{Q}$ outputs of bistable circuits 34 and 60 as first and second inverse modulated signals, respectively. Assuming the same input signal and clocks as shown in FIG. 3, $\overline{Q}$ will be as shown in waveform 90. Bistable circuit 60 provides a delayed $\overline{Q}$ signal 92. Both signals are supplied to a second AND gate 94 (FIG. 1), together with the inverted clock signal 80. The output of second AND gate 94 is shown in waveform 96 and is termed a second digital signal. The second AND gate serves as means for outputting a second digital signal which contains pulses in proportion to the amount of time by which one level of said first inverse modulated signal exceeds the other level. When all three inputs to the AND gate are high, pulses are produced at intervals of not less than the clock intervals of clock 36. In the example shown in FIG. 3, waveform 96 represents the positive polarity component of input signal 70. As can be seen, the location of the pulses roughly corresponds with the regions where input signal 70 is high. Waveform 96 provides a digital representation of the magnitude of the positive half wave components of input signal 70.

Referring to FIG. 1, the present invention can be further employed to produce a digital signal proportional to the magnitude of the full waveform of input signal 70. This is accomplished by supplying the first digital signal output of AND gate 62 and second digital signal output of AND gate 94 to an OR gate 100, which serves as gate means for combining the digital signals and for outputting a summation digital signal 102. Waveform 102 is proportional to the magnitude of the full input signal, including both polarities, which is termed herein "absolute magnitude". Summation signal 102 is a representation of the magnitude of the input signal.

The present invention can also produce useful digital information in the form of an overall polarity reading for the input signal. Referring to FIG. 1, if the first digital signal output from AND gate 62 and second digital signal output from AND gate 94 are supplied to a counter 110, the number of positive and negative pulses can be conveniently compared over any selected interval. One way this can be accomplished is by adding the output of AND gate 62 and subtracting the output of AND gate 94 to produce a total count. A convenient interval can be determined for comparison purposes by supplying the output of clock 36 to the counter. If, over a suitable time period, either a positive or negative count is produced in counter 110, the input signal is offset from zero. If the negative polarity pulses output from AND gate 62 exceed the positive polarity pulses output from AND gate 94, the input signal will have a negative bias, and the size of the count over any interval in counter 110 will be directly proportional to the magnitude of the offset. A positive offset is measured in exactly the same way.

The digital information contained in the signals output from the AND gates of the present invention has useful applications, as described above. In electrical metering, for example, the invention can be conveniently added to a modulator circuit, such as modulator 10. Readings of such information as AC waveform magnitude, waveform offset and polarity, and the magnitudes of the positive and negative half waveforms can be conveniently provided. The system reads the information from the modulated signal, and the input signal is supplied only to the modulator.

It will be understood by those skilled in the art that the components illustrated in the drawings and described in the specification above are all representational, and that a range of components could perform the present invention without components such as AND gates and bistable circuits can be provided with inverting inputs, for example, and such components could readily be used to reproduce the present invention without essential modification. Accordingly, the scope of the invention is to be defined only by the claims set forth below.

What we claim is:

1. A converter for producing a digital signal indicative of the magnitude and polarity of an analog input signal comprising:
   clock means for producing a clock signal which occurs at clock times, separated by predetermined clock intervals;
   modulating means for producing a modulated signal changeable between first and second levels at said clock times and with the time ratio of said modulated signal at said first level to said second level, referred to as a measured duty cycle value, being indicative of the magnitude of said input signal with respect to a reference level; and
   output means for determining the polarity of said input signal with respect to said reference level by sampling said modulated signal at least once every said clock interval, and for producing at least one said digital signal indicative of magnitude and polarity in response to said modulated signal and said polarity determination and wherein said output means assigns a first polarity to said input signal when said modulated signal is at said first level for at least two consecutive said clock intervals and a second polarity when said modulated signal is at said second level for at least two consecutive said clock intervals.

2. The converter of claim 1 wherein said output means includes delay means for delaying said modulated signal so as to produce a delayed modulated signal and gating means for producing said at least one digital signal in response to said modulated signal and said delayed modualated signal.

3. The converter of claim 2 wherein said delay means delays said modulated signal by one said clock interval.

4. The converter of claim 3 wherein said delay means includes a bistable circuit.

5. The converter of claim 4 wherein said bistable circuit is clocked in response to said clock signal and an input of said bistable circuit receives said modulated signal.

6. The converter of claim 2 wherein said output means outputs a first of said digital signals which is indicative of the magnitude of said input signals of a first polarity and a second of said digital signals which is indicative of the magnitude of said input signals of a second polarity.

7. The converter of claim 6 wherein said output means outputs a third of said digital signals which is indicative of the magnitude of both said first and said second polarity input signals.

8. The converter of claim 2 wherein said modulator means includes a second bistable circuit clocked in response to said clock signal having said modulated signal as an output thereof.

9. A converter for producing a digital signal indicative of the magnitude and polarity of an analog input signal comprising:
   clock means for producing a clock signal which occurs at clock times, separated by predetermined clock intervals;
   modulating means for producing a modulated signal changeable between first and second levels at said clock times and indicative of the magnitude of said input signal with respect to a reference level; and
   output means for determining the polarity of said input signal with respect to said reference level by combining said modulated signal with said modulated signal delayed one said clock interval and for producing at least one said digital signal indicative of polarity and amplitude in response to said modulated signal and said polarity determination.

10. The converter of claim 9 wherein the time ratio of said modulated signal at said first level to said second level, referred to as measured duty cycle value, is indicative of said magnitude of said input signal.

11. The converter of claim 10 wherein said modulated signal has a reference duty cycle value when said input signal magnitude is zero and said output means assigns a first polarity to said input signal when said measured duty cycle value is greater than said reference duty cycle value and a second polarity when said measured duty cycle value is less than said reference duty cycle value.

12. A method of converting an analog input signal to a digital signal indicative of the magnitude and polarity of the input signal comprising the following steps:
   producing a clock signal which occurs at clock times separated by predetermined clock intervals;
   producing a modulated signal from said input signal changeable between first and second levels at said clock times, with the time ratio of said modulated signal at said first level to said second level, referred to as a measured duty cycle value, being indicative of the magnitude of said input signal with respect to a reference level;
   determining the polarity of said input signal with respect to said reference level by sampling said modulated signal at least once every said clock interval wherein a first polarity is assigned to said input signal if said modulated signal is at said first level for at least two consecutive said clock intervals and a second polarity when said modulated signal is at said second level for at least two consecutive said clock intervals; and
   producing said digital output signal in response to said modulated signal and said polarity determination.

13. The method of claim 12 wherein said step of determining polarity includes the step of delaying said modulated signal one said clock interval.

14. A converter for producing a digital signal indicative of the magnitude and polarity of an analog input signal comprising:
   clock means for producing a clock signal which occurs at clock times, separated by predetermined clock intervals;
   modulating means for producing a modulated signal changeable between first and second levels at said clock times and with the time ratio of said modulated signal at said first level to said second level, referred to as a measured duty cycle value, being indicative of the magnitude of said input signal with respect to a reference level and wherein said modulated signal has a reference duty cycle value when said input signal magnitude is zero and said output means assigns a first polarity to said input signal when said measured duty cycle value is greater than said reference duty cycle value and a second polarity when said measured duty cycle value is less than said reference duty cycle value; and
   output means for determining the polarity of said input signal with respect to said reference level by sampling said modulated signal at least once every said clock interval, and for producing at least one said digital signal indicative of magnitude and polarity in response to said modulated signal and said polarity determination.

15. The converter of claim 14 wherein said output means includes delay means for delaying said modulated signal so as to produce a delayed modulated signal and gating means for producing said at least one digital signal in response to said modulated signal and said delayed modulated signal.

16. The converter of claim 15 wherein said delay means delays said modulated signal by one said clock interval.

17. The converter of claim 15 wherein said output means outputs a first of said digital signals which is indicative of the magnitude of said input signals of said first polarity and a second of said digital signals which is indicative of the magnitude of said input signals of said second polarity.

18. The converter of claim 15 wherein said modulator means includes a bistable circuit clocked in response to said clock signal having said modulated signal as an output thereof.

19. The converter of claim 16 wherein said delay means includes a bistable circuit.

20. The converter of claim 19 wherein said first bistable circuit is clocked in response to said clock signal and an input of said bistable circuit receives said modulated signal.

21. The converter of claim 17 wherein said output means outputs a third of said digital signals which is indicative of the magnitude of both said first and said second polarity input signals.

* * * * *